United States Patent [19]

Tsang et al.

[11] 4,002,931
[45] Jan. 11, 1977

[54] INTEGRATED CIRCUIT BIPOLAR BOOTSTRAP DRIVER

[75] Inventors: Frederick Tsang, Saratoga; H. T. Chua, Cupertino, both of Calif.

[73] Assignee: Intel Corporation, Santa Clara, Calif.

[22] Filed: June 27, 1975

[21] Appl. No.: 590,922

[52] U.S. Cl. ............................... 307/264; 307/315; 307/DIG. 1; 328/176; 357/51
[51] Int. Cl.² ........................................ H03K 1/14
[58] Field of Search ............ 307/DIG. 1, 203, 213, 307/214, 315, 264, 215, 218; 328/176; 357/51

[56] References Cited
UNITED STATES PATENTS

| | | | |
|---|---|---|---|
| 3,332,028 | 7/1967 | Kayser et al. | 307/315 |
| 3,602,733 | 8/1971 | Aoki | 307/203 |

Primary Examiner—John Zazworsky
Assistant Examiner—Marcus S. Rasco
Attorney, Agent, or Firm—Spensley, Horn & Lubitz

[57] ABSTRACT

An integrated circuit bipolar bootstrap driver has an interface circuit means, a low logic level circuit means and a bootstrap, high logic level circuit means. The interface circuit means is coupled to the low logic level and high logic level circuit means and selectively activates one of the circuit means in response to an input signal. The high logic level circuit means includes an integrated circuit npn Darlington pair and a pnp low current, low speed lateral type integrated circuit transistor in combination with an integrated circuit capacitor which is used to provide a bootstrapped high logic level signal.

14 Claims, 8 Drawing Figures

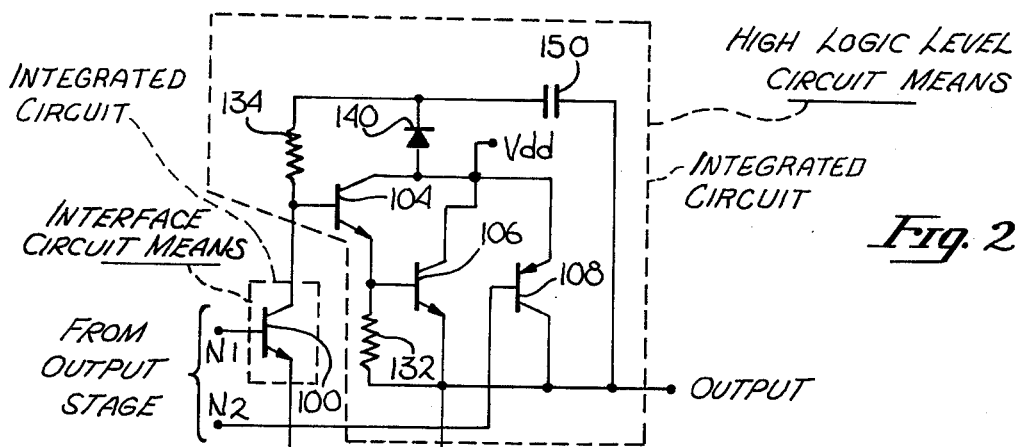
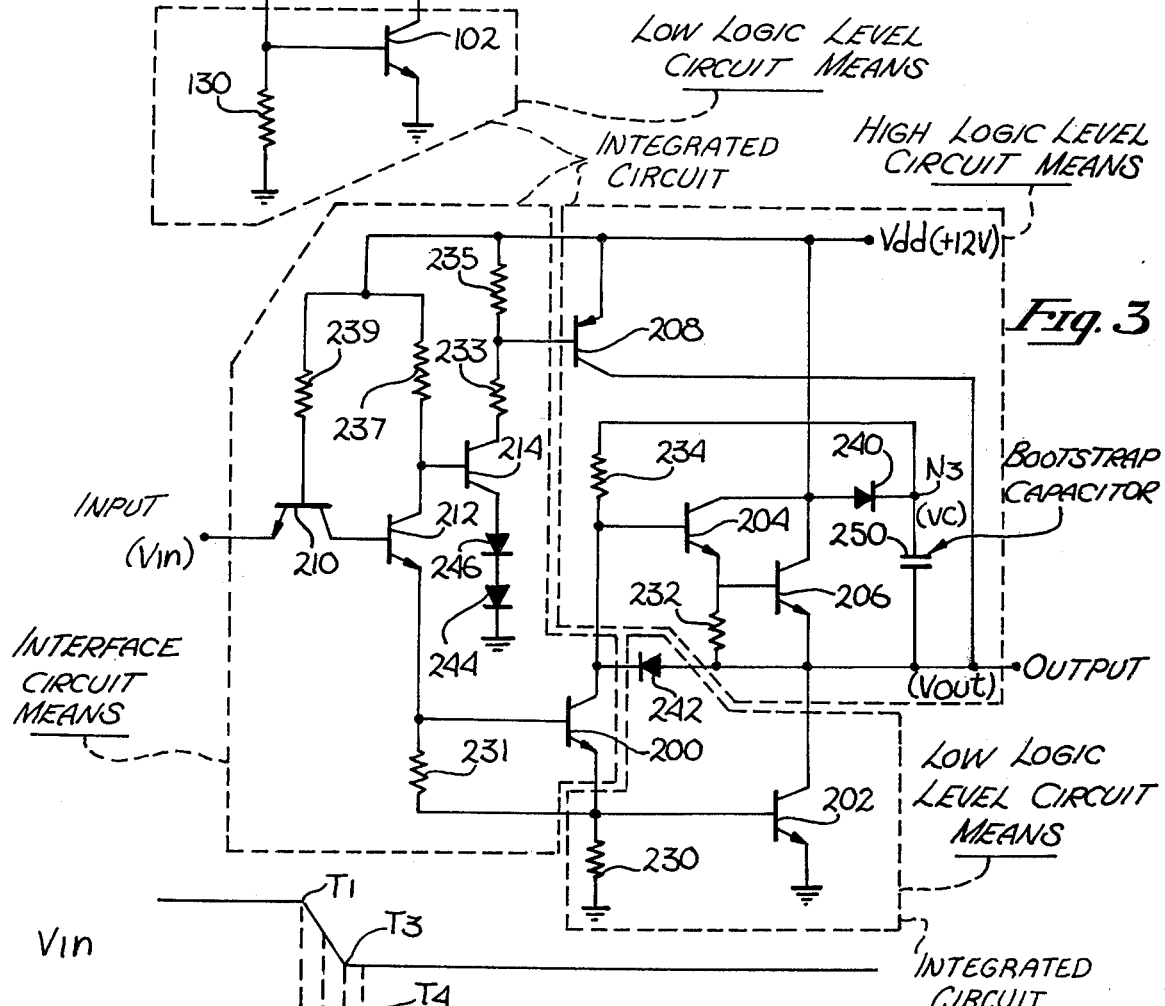
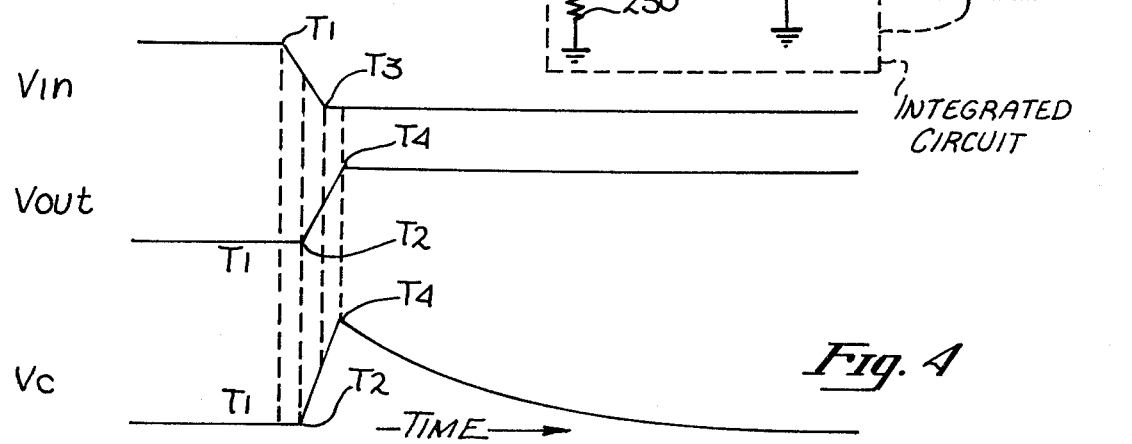

INTEGRATED CIRCUIT BIPOLAR BOOTSTRAP DRIVER

BACKGROUND OF THE INVENTION

1. Field of the Invention

The present invention relates to the field of integrated circuit drivers used in digital systems. More particularly, the present invention relates to the field of bootstrapped, bipolar integrated circuit drivers capable of fast response times in connection with large capacitive loads.

2. Prior Art

In order to drive the clock circuits of digital circuitry, or more particularly the clock inputs of an N-channel MOS random access memory, it is necessary to provide a driver having a fast response and a high logic level output voltage which is as close as possible to the voltage of the integrated circuit power supply. Typically, this means a high logic level output voltage from the driver within one volt of the power supply voltage. However, in practical applications an even greater logic level output signal is required because of power supply noise, unavoidable ohmic drops, parasitic coupling, circuit noise and inductive ringing. The combined effect of these perturbations typically requires a high logic level output voltage from the driver within 0.5 volts or less of the power supply voltage. In addition, these high logic level outputs must be delivered within short time intervals to large capacitive loads which are characterized by large transient current demands.

The prior art driver circuits which are designed to meet the above output performance criteria have been subject to several inherent disadvantages. Such prior art driver circuits have included a bipolar device operated in the emitter follower mode. In order to operate a bipolar, npn device in the emitter follower mode it is necessary to forward bias the base-emitter junction by voltage, Vbe, typically in the range of 0.6 to 0.9 volts. In addition, the emitter current is proportional to the base current, which in turn must flow through a biasing resistor coupled to the power supply. For example, FIG. 1 (a) illustrates one of the simpler prior art inverting drivers. In this prior art circuit a high logic level input signal to the base of transistor 10 causes transistor 10 to conduct. This in turn causes transistor 14 to conduct and thereby to act as a sink and draw the charge on the output node to ground. However, when a low logic level input signal is applied to the base of transistor 10, transistor 10 will turn off. As a result, the voltage at the base of transistor 12 will begin to approach that of the power supply. Nevertheless, the maximum output voltage applied to the output node will never be higher than the supply voltage, Vdd, minus the voltage drop from the base to emitter drop of transistor 12. Thus, the voltage of the output node will approach Vdd – Vbe (12). As the output voltage approaches Vdd – Vbe (12), the amount of base drive on transistor 12 will decrease and the amount of current flowing through transistor 12 will begin to decrease. Typically, the driver of FIG. 1 will tend to be current limited when coupled to a high capacitive load since the drive transistor 12 will fall off before sufficient current has outputted. In addition, because of the rapid decrease of the base drive of transistor 12, the output rise time of the driver will be substantially degraded when current limitation occurs.

In order to remedy the deficiencies of the prior art circuit of FIG. 1(a), the prior art has replaced transistor 12 by a Darlington pair, transistors 16 and 18 (FIG. 1b). The base drive of transistor 16 is now supplied by the additional gain provided by transistor 18. Thus the rise time of the high logic level output is substantially decreased as compared to that of the driver circuit of FIG. 1(a). Nevertheless, the current flowing through transistor 16 will substantially decrease when the output voltage approaches Vdd – Vbe (16). At this point the current requirements of the output will have to be provided by current flowing through transistor 16 and resistor 34. Thus, as mentioned above the base drive of transistor 16 will then substantially decrease as the base voltage approaches the supply voltage and a substantial degradation of the output rise time results.

In order to provide a driver circuit not subject to current limitation, the prior art has modified the circuit of FIG. 1(a) by employing a complementary, saturated output transistor in combination with transistor 20 (FIG. 1(c)). In this prior art circuit, when a low logic level signal is applied to the base of transistor 10, transistor 10 is turned off. The voltage on the base of transistor 20 then rises towards the supply voltage, turning it on, and causing the biased transistor 22 to go into saturation. However, the circuit of FIG. 1(c) is not a practical monolithic design since standard or even exotic bipolar semiconductor processes are not presently available to permit the fabrication on a single chip of a high speed, high current pnp transistor and a high speed, high current npn transistor. Therefore, the prior art has used the driver circuit of FIG. 1(c) wherein the complementary, saturated transistor 22 is an external, discrete device. Such a design has the obvious disadvantages of higher cost and greater bulk. These factors decrease the number of drivers which may be encapsulated in a single package and therefore substantially decrease the device density on system cards.

Another attempt of the prior art to provide a high speed driver which is not subject to current limitation is accomplished by the use of two high voltage power supplies. (FIG. 1(d)). The circuit of FIG. 1(b) may be altered as shown in FIG. 1(d) by coupling the collectors of each transistor of the Darlington pair, i.e. 24 and 26, to a separate high voltage power supply. Therefore, if Vdd2 is greater than Vdd, the base of transistor 24 will tend to approach a greater voltage, thus impressing a higher voltage upon the second transistor 26 of the Darlington pair. As a result the output voltage may rise to a level much closer to the supply voltage, Vdd, before transistor 26 becomes current limited. Clearly, the disadvantages of having separate power supplies includes a higher system cost entailed by the additional supply, additional space required to house the second supply, and an extra power supply bus which must be wired to and provided on many of the cards of the system.

BRIEF SUMMARY OF THE INVENTION

The present invention is a bipolar bootstrap driver in an innovated circuit on a single chip having a single power supply. The driver comprises a high logic level circuit means, a low logic level circuit means and an interface circuit means. The high logic level circuit means is coupled to an output node and provides a fast, bootstrapped high logic level output voltage and fast, high current in response to a first input voltage. The high logic level circuit means comprises a bipolar, biased Darlington transistor pair, a lateral type bipolar transistor of a type complementary to that of the Darlington transistor pair, and a resistor and capacitor forming a series RC network in circuit across the Darlington transistor pair. The lateral bipolar transistor is coupled and parallel to the Darlington transistor pair. The low logic level circuit means is coupled to the output node and provides a fast low logic level output voltage in response to a second input voltage. The interface circuit means selectively activates the high and low logic level circuit means in response to the first and second input voltages. The interface circuit means is coupled to the high and low logic level circuit means and an input node. All of the above means are formed as part of an integrated circuit.

BRIEF DESCRIPTION OF THE DRAWINGS

FIG. 2 is a circuit schematic illustrating one embodiment of the present invention showing an integrated circuit, bipolar driver which utilizes a bootstrapping capacitor, a Darlington pair and a complementary output transistor whereby a driver may be fabricated on a single chip using a single high voltage power supply and which is characterized by a fast rise time and high current output.

FIG. 3 is a circuit schematic of another embodiment of the present invention wherein the embodiment illustrated in FIG. 2 is modified and combined with additional interface circuitry to provide an integrated circuit, bootstrap, bipolar driver capable of boosting a TTL input threshold voltage to a voltage signal compatible with a clock input of a MOS RAM.

FIG. 4 is a timing diagram showing input, output and bootstrapping voltage signals of the circuit illustrated in FIG. 3.

DETAILED DESCRIPTION OF THE PREFERRED EMBODIMENTS

Figure 1A:
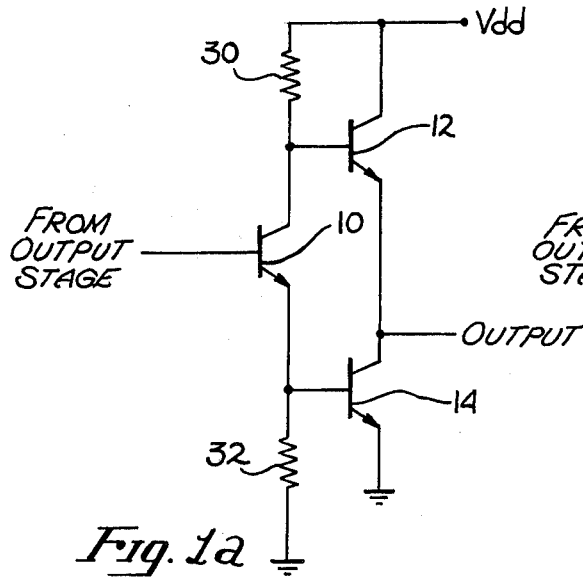
FIG. 1(a) – 1(d) are circuit schematics of bipolar drivers, known to the prior art.
Figure 1B:
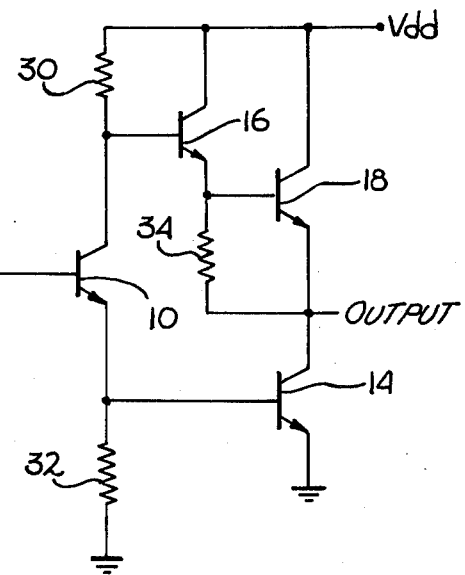
Figure 1C:
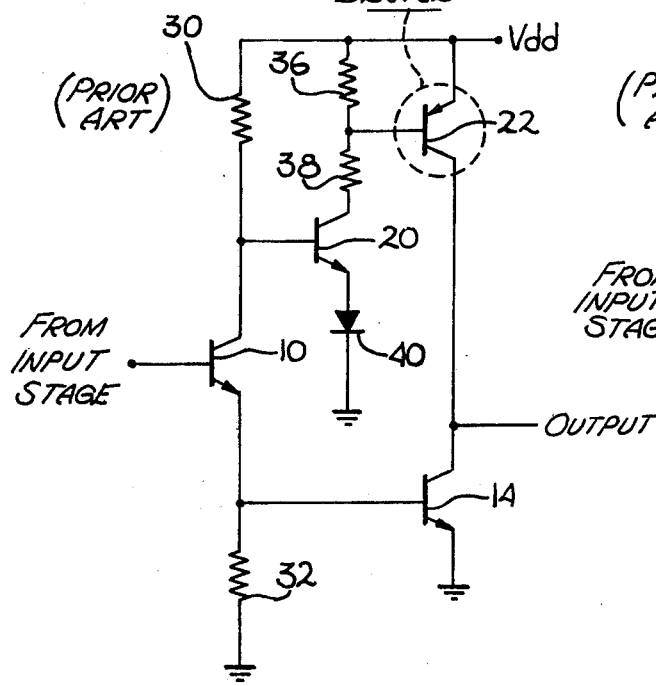
Figure 1D:
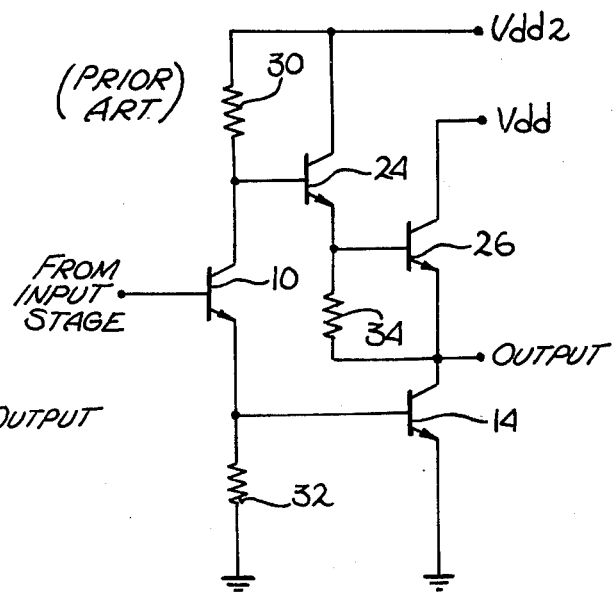

The present invention is a bootstrap, bipolar integrated driver contained on a single chip and using a single, high voltage power supply. The driver has a low level logic circuit means, a high level logic circuit means and an input interface circuit means. Typically, the low level logic circuit means and the input interface circuit means is comprised of biased npn, bipolar transistors connected in circuit to form an interfacing inverter, in the case of the input interface, and a logic switch in the case of the low logic level circuit means. The high logic level circuit means is comprised of a biased npn Darlington pair in parallel with a pnp low speed, low current bipolar transistor. A capacitor is coupled between the output of the driver and the input to the Darlington pair in order to bootstrap a portion of the rising output voltage into the input of the high logic level circuit means.

A simple embodiment of the present invention is schematically illustrated in FIG. 2. In this embodiment the input interface circuit means consists solely of a single bipolar transistor 100. The low logic level circuit means comprises the bipolar transistor 102 and resistor 130. The bootstrapped, high logic level circuit means comprises the remaining elements, namely, the Darlington pair, formed by transistors 104 and 106, biased by resistor 132, the complementary low speed, low current, bipolar transistor 108, diode 140, capacitor 150, and resistor 134. All of these circuit elements are formed on or in a single integrated circuit substrate.

In this embodiment of the present invention, the circuit is provided with a first and second input node N1 and N2. The first input node N1 is coupled to the base of transistor 100 while the second input node N2 is coupled to the base of complementary transistor 108. A high logic level signal applied to the base of transistor 100 and a high level logic signal applied to the base of transistor 108 will turn 100 on and will turn 108 off. When transistor 100 conducts, a base drive is applied to transistor 102 which turns it on. Since the emitter of 102 is coupled to ground or a low logic level, the output node of the circuit is pulled to ground through the current sink provided by transistor 102. When transistor 100 conducts, the base of transistor 104 is pulled low enough to maintain transistor 104 in the off state. Thus transistor 104 is turned off, effectively disconnecting the output from the power supply, Vdd, and facilitating the pull down operation of transistor 102. The integrated circuit capacitor 150 may be fabricated as part of the substrate by processes well known to the art either by exploiting the capacitance of a pn junction or forming a pair of opposed parallel plates, one of semiconductor material (polycrystalline or monocrystalline silicon) and the other of aluminum or polycrystalline silicon insulatively separated by a silicon oxide layer. One embodiment of the integrated circuit capacitor 150 is shown in greater cross sectional detail in FIG. 5.

If a low logic level voltage is applied to input node N1 and a low logic level is applied to input node N2, a fast, high current output signal will be provided at the output node of the circuit. For example, as the low logic level signal applied to the base of transistor 100 turns transistor 100 off, the low logic level signal applied to the base of transistor 108 begins to turn transistor 108 on. In the present embodiment, transistor 108 is a low speed, low current, lateral type pnp bipolar transistor, well known to the prior art, which may be easily fabricated on a chip having semiconductor parameters designed to maximize the performance of npn bipolar devices. A typical, lateral pnp employed in the present invention may have a current gain of approximately unity and a maximum switching frequency of approximately 70 kHz. These parameters are to be compared to a current gain in excess of 50 and a maximum switching frequency over 1 GHz which characterizes the npn transistors in the same circuit. The lower performance characteristics of the lateral pnp transistor is primarily due to the limitations imposed on device geometry by the optical resolution and registration of multiple masks. In addition performance is further degraded by the limits on practical control of the doping levels of the p type regions in the n type epitaxial layer in which the pnp transistor is usually formed.

Figure 5:
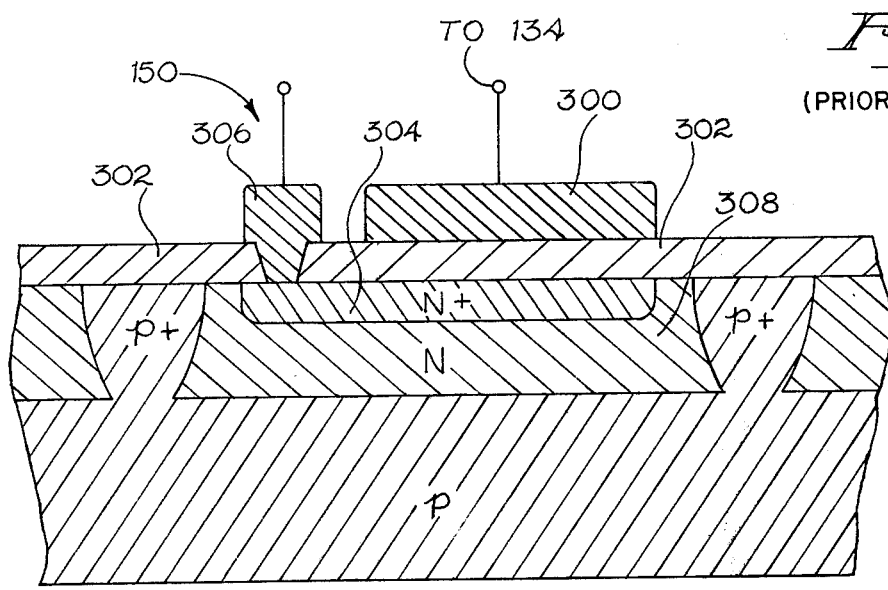
FIG. 5 is a cross section of that portion of the integrated circuit showing one embodiment of capacitor 150.

As transistor 100 turns off, the voltage supplied to the base of transistor 104 through diode 140 and resistor 134 approaches that of the supply voltage, Vdd (typically having a value of more than 5 volts). The base drive to transistor 104 turns transistor 104 on and thereby drives transistor 106 on. The output voltage from the emitter of transistor 106 is applied to the output node and is characterized by a fast rise time due to the gain provided to the base driver of transistor 106 by virtue of transistor 104. As the voltage at the output node rises, a positive voltage step is coupled through capacitor 150 to the base of transistor 104. Thus the base drive of the Darlington pair, 104 and 106, is bootstrapped to a level equal to or greater than the supply voltage. The total switching time for the circuit illustrated in FIG. 2 is typically about 20 nanoseconds as compared to a switching time of approximately two to three times as long for the prior art circuits of FIG. 1a – 1d. As the output voltage approaches a value at which transistor 106 begins to become current limited, by virtue of the decreasing base to emitter bias, the steady state (DC) current demands of the circuit load begin to be met by the saturated, complementary transistor 108. Transistor 108 has been slowly going into a saturated state during the boot strap rise time afforded by the Darlington pair and the RC constant of capacitor 150 and resistor 134. Typically capacitor 150 may have a value in the range of 30 – 50 pf, while resistor 134 is chosen to have a magnitude of about 5000 ohms, giving an RC constant of approximately 250 nanoseconds. One embodiment of capacitor 150, when formed as an integral part of the integrated circuit, is illustrated in a simplified cross sectional view in FIG. 5. The embodiment of FIG. 5 shows a conductive plate 300 disposed on an insulative layer 302 and overlying at least in part semiconductor plate 304. In the embodiment illustrated, plate 304 is a doped diffusion region formed in substrate 308. Electrical coupling to plate 304 may be by means of metalization 306.

Thus, it may readily be appreciated that a bipolar integrated circuit driver on a single chip, utilizing a single high voltage power supply, can be fabricated by combining a bootstrapped Darlington pair in conjunction with a low speed complementary saturated current source according to the present invention.

A second embodiment of the present invention, shown in FIG. 3, illustrates a practical application of the invented device whereby TTL (transistor-transistor logic) threshold input voltages may be boosted through the bootstrap high speed, high current driver of the present invention to provide an output signal compatible with the high capacitive loads of a clock input of a MOS random access memory. In this embodiment the numerals have been changed to a "200" series with similar circuit elements having the same designation as indicated in connection with FIG. 2 with the only change in assignation being from "100" to "200". The embodiments illustrated in FIGS. 2 and 3 are very similar. The logic low level circuit means is unchanged with exception of a coupling with an additional biasing resistor 231, and a feedback diode 242. The high logic level circuit means is also substantially unchanged, except as to the biasing of the pnp saturated transistor 208. The interface input circuit means still incorporates a transistor 200, similar to that of transistor 100 of FIG. 2, but also incorporates a large number of other elements which are described in detail below.

In the embodiment illustrated the low logic level circuit means is comprised of resistor 230, transistor 202 and diode 242. The high logic level circuit means is comprised of the biased Darlington pair 204 and 206, capacitor 250, diode 240 and a low speed, low current complementary transistor 208. The input interface of the embodiment illustrated in FIG. 3 is comprised of transistor 200 and a circuit comprised of transistors 210, 212 and 214 together with diodes 244 and 246, and biasing resistors 231, 233, 235, 237, and 239.

When a high logic level voltage, typically in excess of two volts, is applied to the input node, the base to emitter junction of transistor 210 is reversed biased and therefore the transistor 210 is set in the off state. The current through transistor 210 is shunted through its forward biased base-collector "diode" and thus maintains transistor 212 in the on state. Transistor 200 is turned on by transistor 212, which in turn sets transistor 202 in the on state. Transistor 202 functions in a similar manner to transistor 102 discussed above, that is, transistor 202 acts as a current sink and pulls the output node to a low logic level. The base drive of transistor 202 is derived in part from the emitter-collector current of transistor 200. When the output voltage is high, diode 242 is foward biased and serves as a current source for transistor 200 which in turn increases the base drive of transistor 202. When transistor 212 is on, the base of transistor 214 is pulled low enough such that the base of the transistor 214 is reversed biased and transistor 214 is clamped in the off state. It is to be noted that when transistor 212 is on, the base of transistor 214 is coupled to ground through a series combination of resistor 231 in parallel with the base to emitter "diode" of transistor 200 and resistor 230 in parallel with the base to emitter "diode" of transistor 202. If the voltage drop through this path, when transistor 212 is on, is chosen to be equal to or less than the 214 plus the threshold voltage drops of diodes 246 and 244, transistor 214 will remain off whenever transistor 212 is on.

When a low logic level signal is applied to the emitter of transistor 210, the base to emitter junction of transistor 210 will be forward biased and the collector of transistor of 210, or the base of transistor 212 will be pulled to the low logic level, typically less than 0.8 volt. Transistor 212 will therefore turn off together with transistors 200 and 202. As transistor 212 begins to turn off, the base of transistor 214 will rise toward the supply potential. Thus, transistor 214 will turn on causing pnp transistor 208 to begin to conduct and move toward the saturated state.

As discussed above, when transistor 200 turns off, the base voltage of transistor 204 will begin to rise and approach the supply voltage Vdd via a circuit through diode 240 and resistor 234. Transistor 204 begins to turn on and drives the base of transistor 206 to a voltage, Vbe over the output voltage, where the voltage on the base of transistor 206 will clamp. Additional output current is then provided through a circuit including the collector-emitter of transistor 204 and resistor 232. As the voltage on the output node rises, the voltage at node N3 also increases above Vdd by means of charge coupled through capacitor 250. This increased voltage is in turn bootstrapped back to the base of transistor 204 through resistor 234 which further drives transistor 206 and increases the output voltage. The bootstrapping feedback continues to increase until the base to collector junction of transistor 204 becomes forward biased. At this point the base of transistor 204 is clamped at a voltage above the supply voltage, Vdd, equal to Vdd – Vbe (240). By the time the base of transistor 204 becomes clamped, the voltage at node N3 has reached a maximum. Node N3 is generally maintained at a voltage equal to the supply voltage minus the voltage drops through diode 240 (Vdd – Vbe (240)). A transient (AC) voltage is then added onto this fixed voltage due to the feedback charge coupled through capacitor 250, i.e., a bootstrapping voltage, Vout. The transient feedback on bootstrapping charge will not remain indefinitely fixed on node N3, but will discharge through transistor 204 at a rate determined by the RC network of resistor 234 and capacitor 250. Therefore, the voltage at node N3 will be lessened by an amount denoted as V(RC). The maximum then is close to the supply voltage minus the voltage drop across diode 240 plus the output voltage and minus that portion of the potential across capacitor 250 lost by charge dissipation through resistor 234, (i.e., Vdd − Vbe (240) + Vout − V(RC)). When the base voltage of transistor 204 becomes clamped, it can readily be appreciated that the output voltage will cease to rise, and the voltage at node N3 will decrease at a rate determined by the time constant fixed by capacitor 250 and resistor 234. However, the output voltage will remain stable and will not start to decrease until the voltage at the base of transistor 204 (or node N3) decreases to a magnitude which approaches or is equal to the Vout + Vbe(204). By this time, complementary transistor 208, which began to turn on as soon as transistor 212 turned off, will begin to enter the saturated state and will maintain the output voltage at the supply voltage, Vdd, minus the collector to emitter voltage drop, through transistor 208.

The timing diagram of FIG. 4 illustrates the relationship between the input and output voltages and the voltage Vc at node N3. As the input voltage starts to drop from a high logic level, transistors 200, 202, and 212 are turning off while transistor 214 is turning on. After a time interval, T1 − T2, as determined by the effective switching times of the above mentioned transistors, the output voltage will begin to rise as transistors 204 and 206 begin to conduct. During this time capacitor 250 continues to bootstrap the output voltage until the base of transistor 204 becomes clamped at time, T4, when the voltage, Vc, at node N3 reaches its maximum. After time, T4, it can be seen that the voltage, Vc, at node N3 decreases exponentially back to a low logic level while the output voltage remains constant at a voltage determined by the collector to emitter drop across saturated transistor 208. Thus transistor 208 serves to supply sufficient DC or steady state current to the output load.

Thus, according to the present invention an integrated circuit, bootstrap bipolar driver having a single high voltage power supply and no discrete elements can be fabricated so as to provide a fast output voltage with a magnitude close to that of the high voltage supply. The driver is, in addition, able to provide this output to large capacitive loads without current limitation. The present invention achieves these results without additional circuit or system costs relative to the prior art and achieves these results at a considerable space savings.

Such a driver is not only useful in transforming TTL (transistor-transistor-logic) threshold level signals to signals compatible with MOS random access memory (RAM) clocks (as illustrated at FIG. 3), but can similarly transform ECL (emitter-coupled-logic) signals to signals compatible with MOS RAM clocks.

We claim:
1. In an integrated circuit having a single power supply, a bipolar bootstrap driver said driver comprising:
  A. high logic level circuit means coupled to an output node for providing a fast, boot-strapped high logic level output voltage and fast high current in response to a first input voltage, said high logic level circuit means comprising:
    1. a bipolar, biased Darlington transistor pair;
    2. a bipolar transistor of a complementary type to said Darlington transistor pair, said bipolar transistor coupled in parallel to said Darlington transistor pair; and
    3. a resistor and capacitor forming a series RC network in circuit across said Darlington transistor pair;
  B. low logic level circuit means coupled to said output node for providing a fast low logic level output voltage in response to a second input voltage; and
  C. an interface circuit means for selectively activating said high and low logic level circuit means in response to said first and second input voltages, said interface circuit means coupled to said high and low logic level circuit means and an input node.
2. The driver of claim 1 wherein said Darlington transistor pair is a cascaded pair of bipolar, integrated circuit transistors; and said lateral type bipolar transistor is a low speed, low current integrated circuit transistor.
3. The driver of claim 2 wherein: said capacitor is formed by a pn junction.
4. The driver of claim 2 wherein:
  said capacitors is formed by insulatively separated opposed parallel plates of semiconductor and conductive material.
5. The driver of claim 2 wherein:
  said cascaded pair of bipolar integrated circuit transistors are each npn transistors; and
  said lateral type bipolar transistor is a pnp transistor.
6. The driver of claim 1 wherein:
  said low logic level circuit means is an integrated circuit, bipolar transistor used to switch said output node to a current sink and to set said output node to a low logic level.
7. The driver of claim 6 wherein:
  said interface circuit means is an integrated circuit bipolar transistor used to provide an activating signal to said low logic level circuit means in response to a high logic level signal, and to provide an activating signal to said high logic level circuit means in response to a low logic level signal.
8. In an integrated circuit, a bipolar bootstrap driver comprising:
  an input interface circuit means including a npn bipolar transistor having its base coupled to a first input node;
  a low level logic circuit means including a first resistor having a first terminal coupled to the emitter of said interface transistor and a second terminal coupled to a ground fixed at a low logic level, and a first npn bipolar, transistor having its base coupled to said first terminal of said first resistor, its emitter coupled to said ground, and its collector coupled to an output node; and
  a bootstrap high logic circuit means including a second and third bipolar npn transistor, said second transistor having its base coupled to the collector of said interface transistor, the emitter of said second transistor coupled to the base of said third transistor, the collector of said second transistor coupled to the collector of said third transistor, the base and emitter of said third transistor coupled together by a second resistor, the emitter of said third transistor coupled to said output node, and the collector of said third transistor coupled to a high voltage power supply, including a bootstrapping capacitor having a first terminal coupled to one terminal of a third resistor, the other terminal of said third resistor coupled to the base of said second transistor, and said capacitor having a second terminal coupled to said output node, including a diode having its anode coupled to said voltage supply and its cathode coupled to said first terminal of said capacitor, and including a pnp lateral type bipolar transistor having its emitter coupled to said voltage supply, its base coupled to a second input node, and its collector coupled to said output node.

9. The driver of claim 8 further comprising:
an interface circuit having an input terminal, said interface circuit coupled to said first and second input nodes of said driver to selectively provide an activating signal to said first input node in response to a first logic level input signal at said input terminal and an activating signal to said second input node in response to a second logic level input signal at said input terminal, to boost a TTL input threshold voltage to a voltage signal compatible with a MOS random access memory clock.

10. The driver of claim 9 wherein said interface circuit comprises:
a first npn transistor having its emitter coupled to said input terminal, its base resistively coupled to a high voltage power supply;
a first npn transistor having its base coupled to the collector of said first pnp transistor, having its emitter coupled to said first input node, and resistively coupled to said ground, and having its collector resistively coupled to said high voltage power supply; and
a second npn transistor having its base coupled to the collector of said first npn transistor, having its emitter coupled to said ground through at least one forward biased diode and its collector resistively coupled to said high voltage power supply and to said second input node.

11. The driver of claim 1 wherein said bipolar transistor is a lateral bipolar transistor.

12. In an integrated circuit having a single power supply, a bipolar bootstrap driver said driver comprising:

A. high logic level circuit means coupled to an output node for providing a fast, bootstrapped high logic level output voltage and fast high current in response to a first input voltage, said high logic level circuit means comprising:
  1. a bipolar, biased Darlington transistor pair;
  2. a bipolar transistor of a complementary type to said Darlington transistor pair, said lateral transistor coupled in parallel to said Darlington transistor pair;
B. low logic level circuit means coupled to said output node for providing a fast low logic level output voltage in response to a second input voltage;
C. an interface circuit means for selectively activating said high and low logic level circuit means in response to said first and second input voltages, said interface circuit means coupled to said high and low logic level circuit means and an input node; and
D. all of the above said means formed as part of an integrated circuit.

13. The driver of claim 12 wherein said bipolar transistor is a lateral bipolar transistor.

14. In an integrated circuit having a single power supply, a bipolar bootstrap driver said driver comprising:

A. high logic level circuit means coupled to an output node for providing a fast, bootstrapped high logic level output voltage and fast high current in response to a first input voltage, said high logic level circuit means comprising:
  1. a bipolar, biased Darlington transistor pair; and
  2. a resistor and capacitor forming a series RC network in circuit across said Darlington transistor pair;
B. low logic level circuit means coupled to said output node for providing a fast low logic level output voltage in response to a second input voltage;
C. an interface circuit means for selectively activating said high and low logic level circuit means in response to said first and second input voltages, said interface circuit means coupled to said high and low logic level circuit means and an input node; and
D. all of the above said means formed as part of an integrated circuit.

* * * * *